(12) United States Patent
Filseth et al.

(10) Patent No.: US 6,611,953 B1
(45) Date of Patent: Aug. 26, 2003

(54) MASK CORRECTION OPTIMIZATION

(75) Inventors: Paul G. Filseth, Los Gatos, CA (US); Mario Garza, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 186 days.

(21) Appl. No.: 09/879,846

(22) Filed: Jun. 12, 2001

(51) Int. Cl.[7] .............................................. G06F 17/50
(52) U.S. Cl. ......................................... 716/19; 716/21
(58) Field of Search ..................... 716/19, 21; 382/144; 430/5

(56) References Cited

U.S. PATENT DOCUMENTS 5,723,233 A * 3/1998 Garza et al. ................... 430/5
6,081,658 A * 6/2000 Rieger et al. ................. 716/21
6,249,597 B1 * 6/2001 Tsudaka ...................... 382/144
6,453,457 B1 * 9/2002 Pierrat et al. ................. 716/19

* cited by examiner

Primary Examiner—Leigh M. Garbowski
Assistant Examiner—Brandon Bowers
(74) Attorney, Agent, or Firm—Westman, Champlin, Kelly

(57) ABSTRACT

A mask is designed for use in a photolithographic process to offset effects of light diffraction. At least one region having a length along each edge of a mask feature is defined. Error values at selected points on the mask are derived from an aerial image of the mask features and a target light intensity measured during IC fabrication process development. A matrix is derived representing the contributions of light amplitude due to movement of each region in a direction normal to the region. The amount of movement of each region is based on least-squares fitting the linear expressions in the matrix to the error values. The amount of movement may be adjusted for movement of an adjacent region.

26 Claims, 5 Drawing Sheets

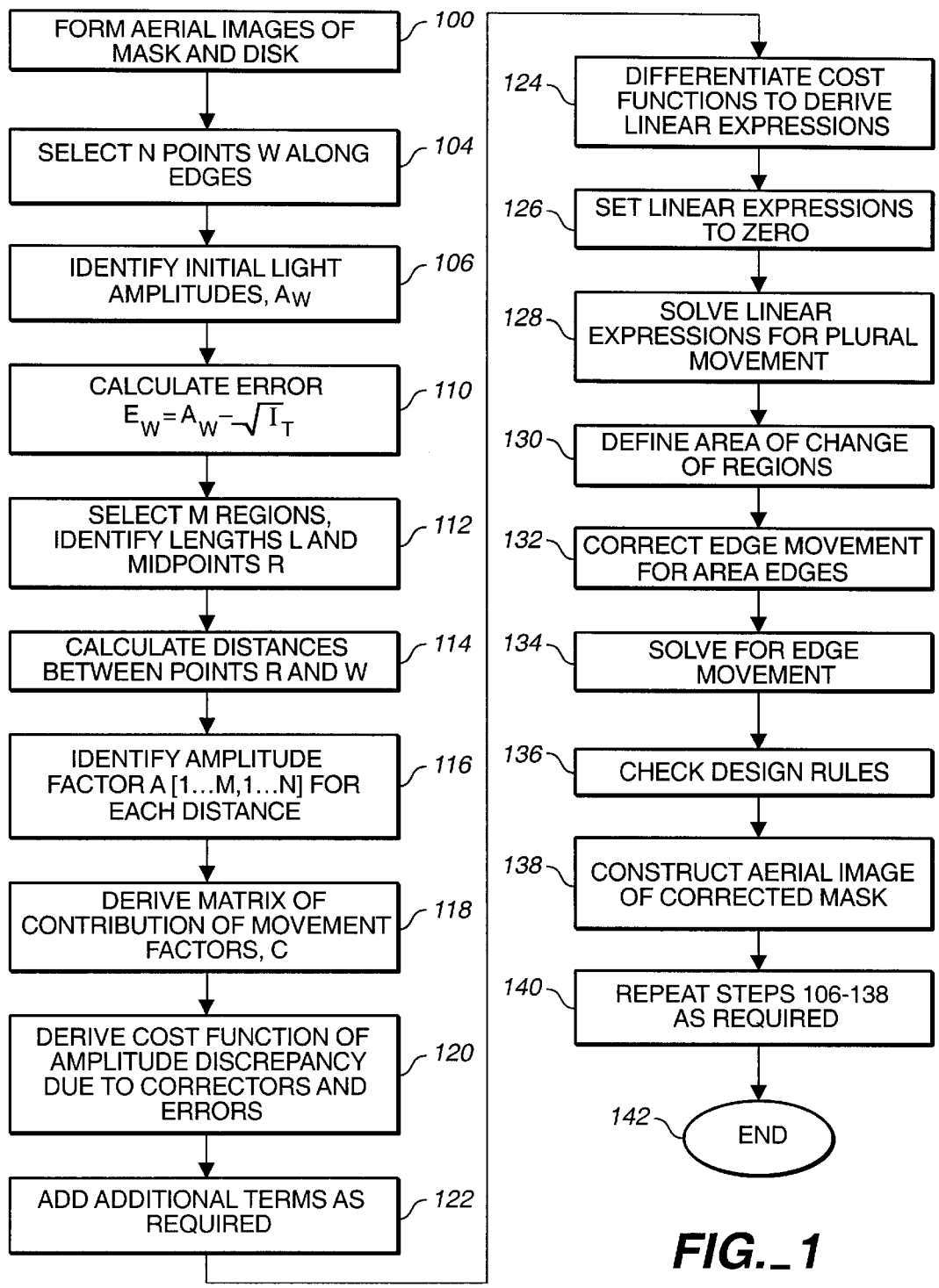
*FIG._1*

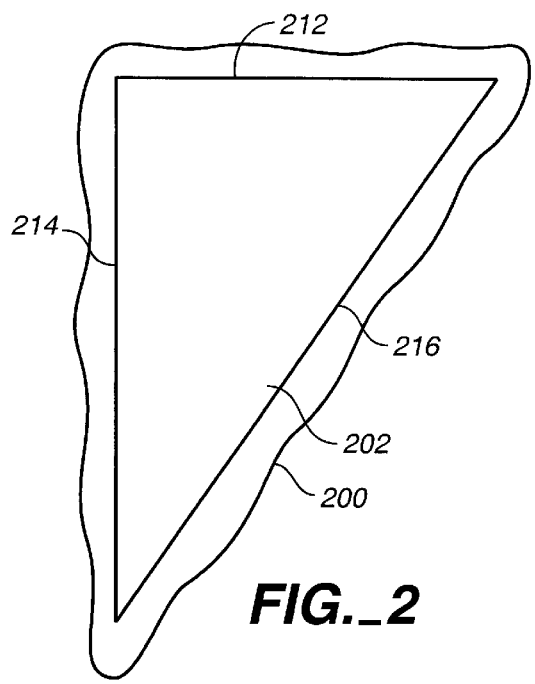
FIG._2
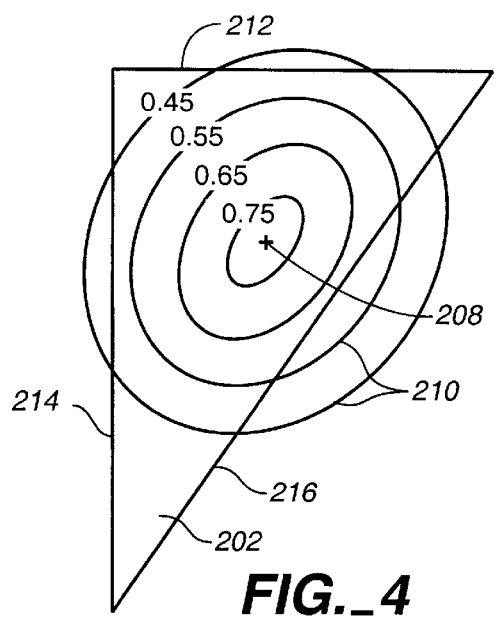
FIG._4
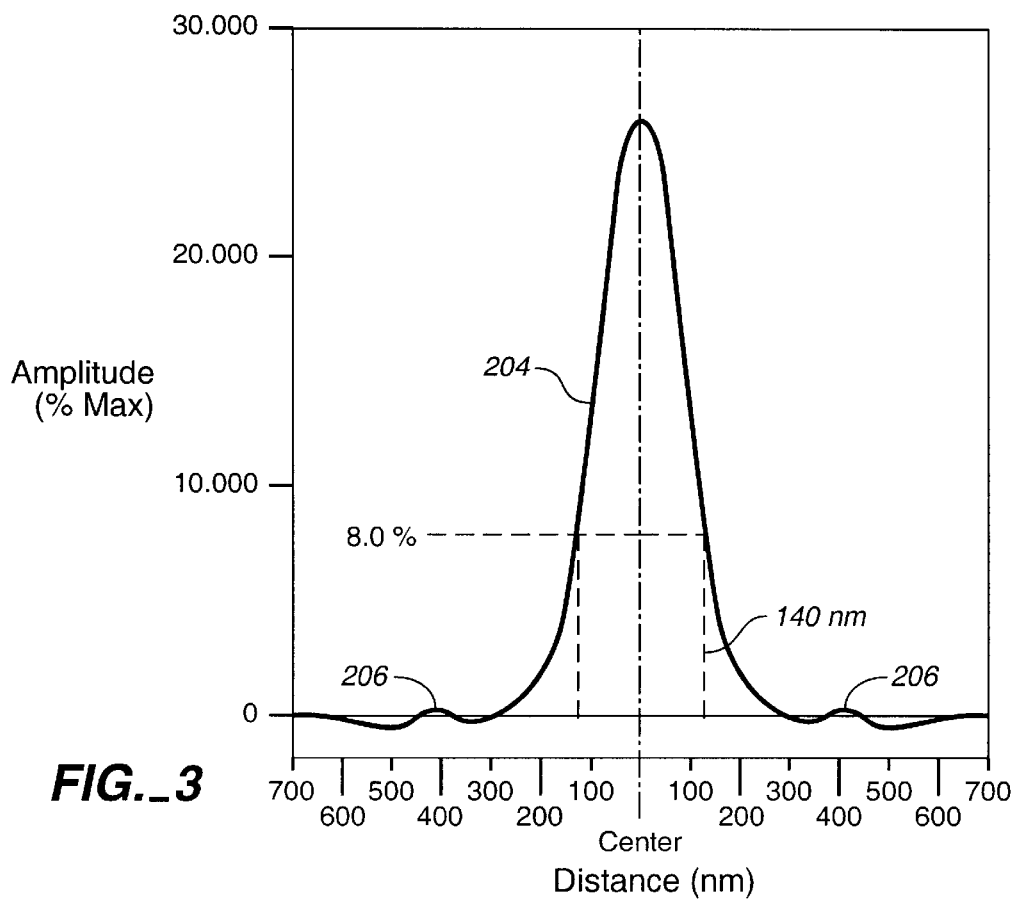
FIG._3

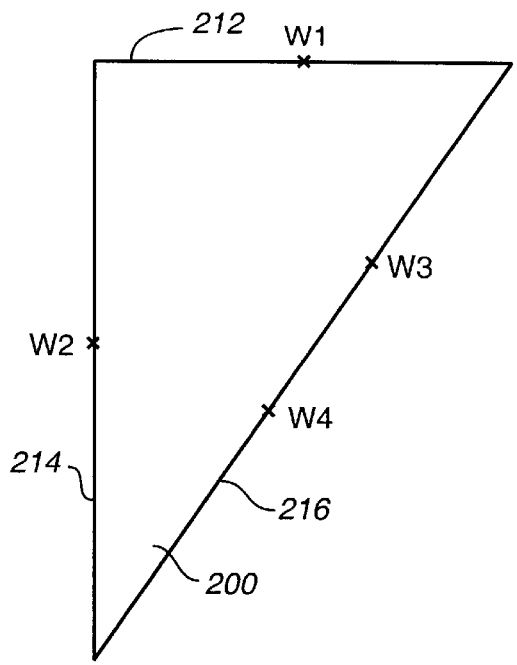
FIG._5
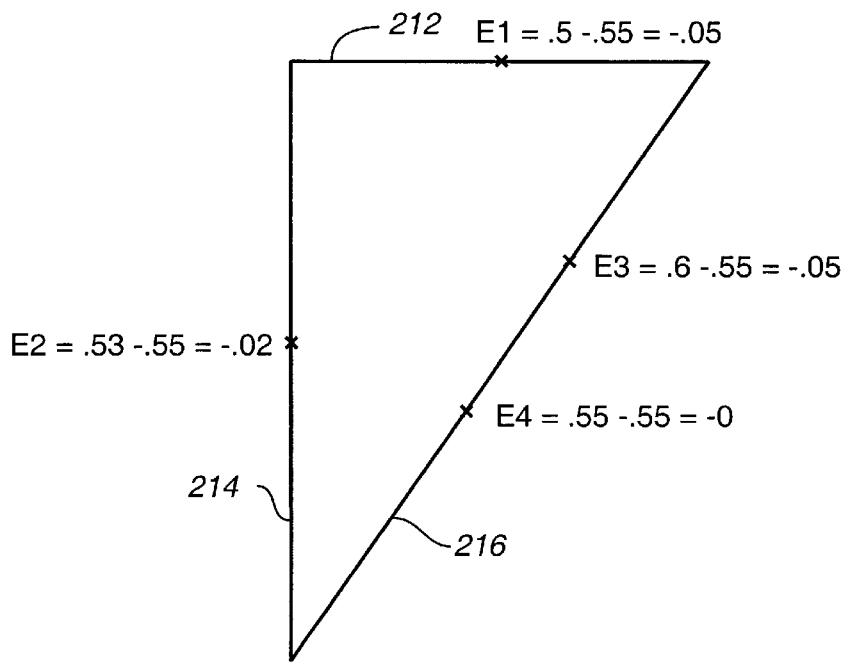
FIG._6

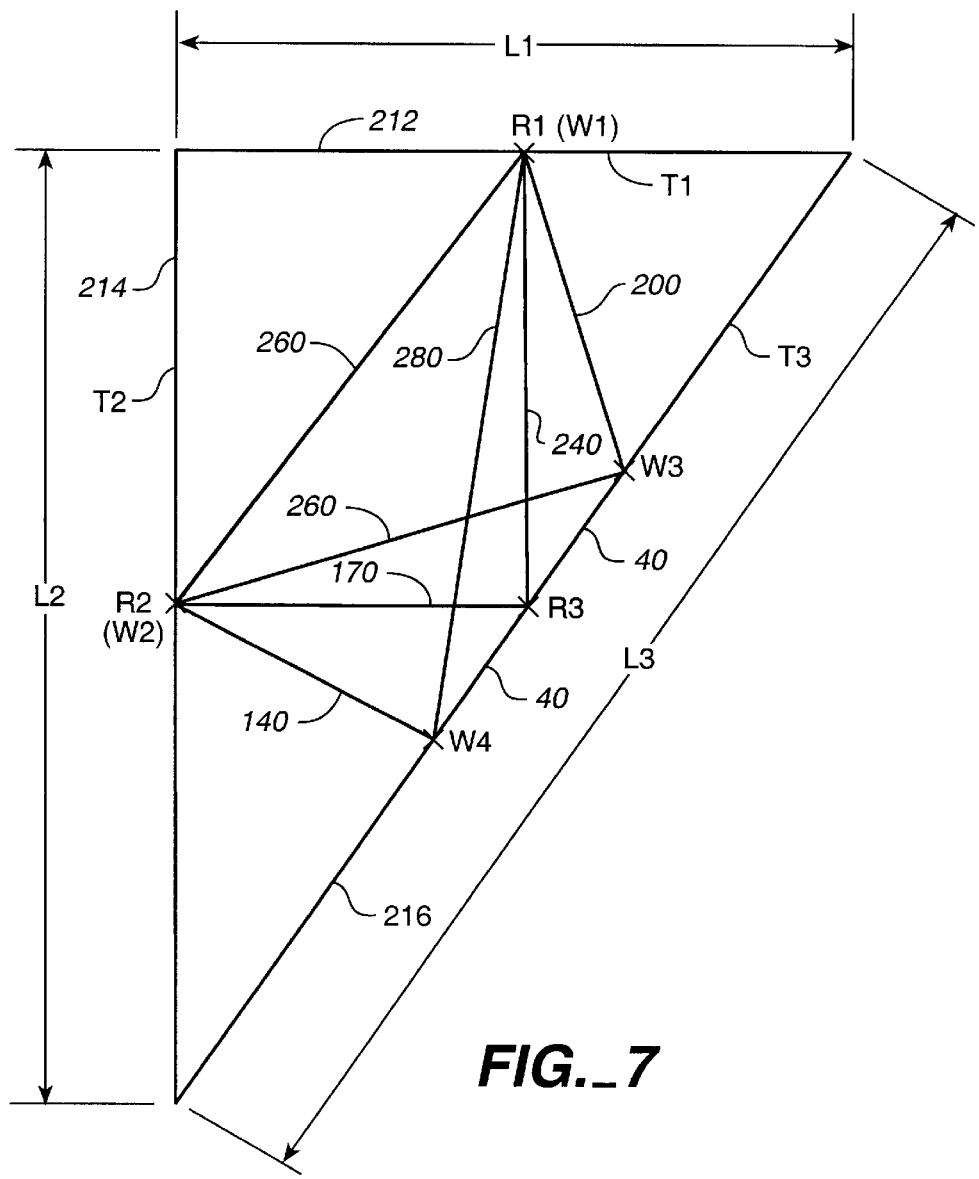
FIG._7

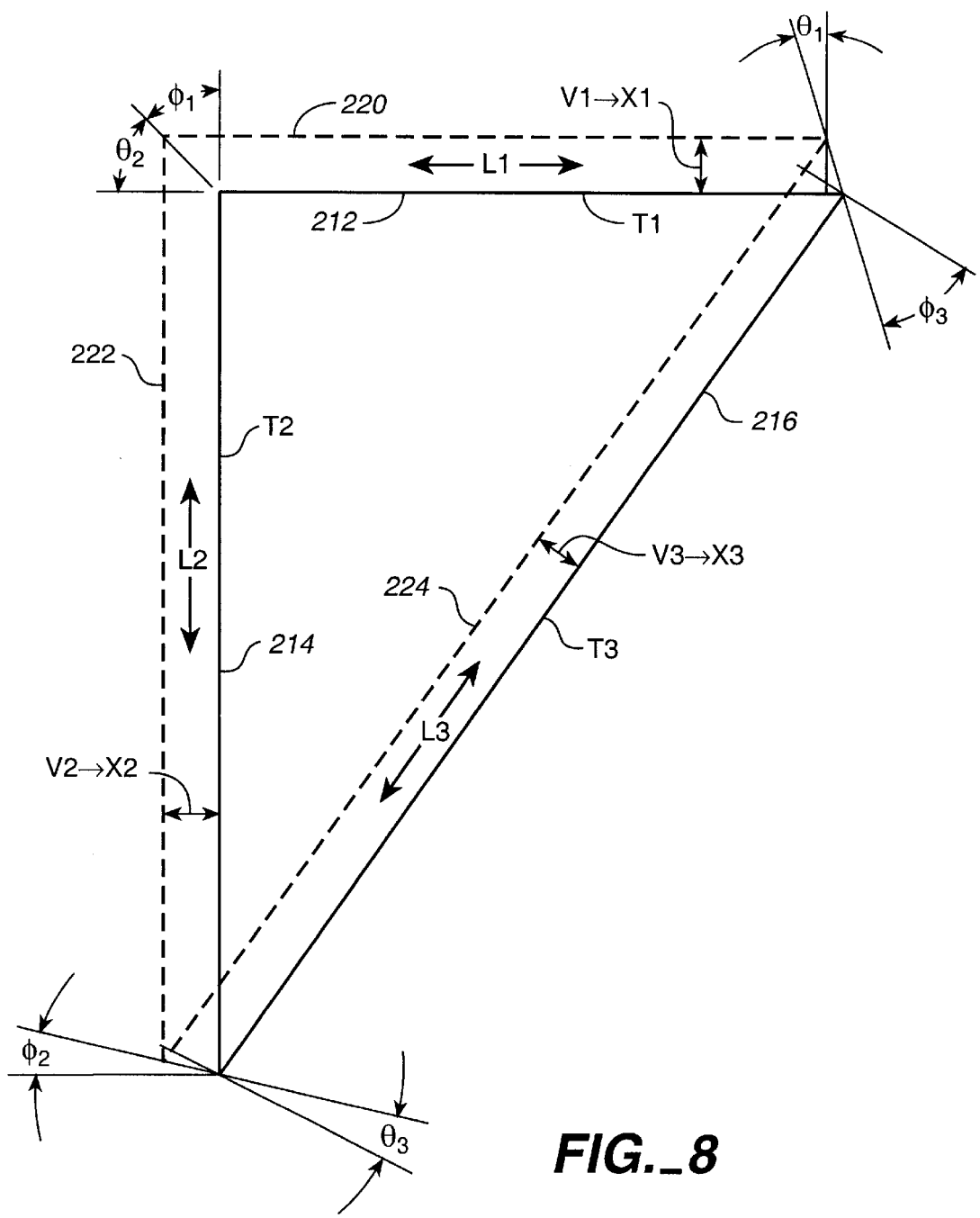
FIG._8

MASK CORRECTION OPTIMIZATION

FIELD OF THE INVENTION

This invention relates to electronic chip fabrication, and particularly to correction of masks used in chip fabrication.

BACKGROUND OF THE INVENTION

Thin film integrated circuits (ICs), commonly called "chips" or "IC chips", are fabricated by a photolithographic process by which a photographic mask is positioned adjacent a substrate, such as a wafer, for adding features to or subtracting features from the substrate. Thus, each mask defines a layer of material to be added to the substrate, or material to be removed from a layer already on a substrate. Typically, the mask is used with another material, such as a photoresist, which is exposed by light through the image on the photographic mask to define the feature being formed on the substrate to form the chip. The feature is then deposited onto, or etched from, a layer on the substrate forming the chip.

The density of features on a chip is, in part, limited by the size of the photographic image of the mask. However, diffraction of light waves during photographic imaging introduces distortion in the resulting shapes of features on the substrate. A technique known as optical proximity correction (OPC) permits compensation of distortion due to diffraction of light waves by altering the mask into a distorted shape so that it will form the correct shape of the feature on the substrate. Using OPC, the features formed on the substrate may be smaller and more closely packed (dense) without forming breaks or shorts in the circuitry.

OPC is an iterative technique by which a computer model of process light intensity is applied to a computer model of a mask to identify the expected shape of a resulting wafer feature. The model mask is distorted through successive iterations until a mask model is derived that will produce features on actual wafers more closely replicating the desired wafer features. Existing OPC techniques require considerable time and consequently are expensive. Accordingly, there is a need for an improved technique to form shapes on a mask that, when light diffracts through the mask, produces a close approximation of the desired shape for the feature on the substrate.

SUMMARY OF THE INVENTION

One aspect of the present invention is a process for designing a mask for use in a photolithographic process to offset the effects of light diffraction. At least one region, having a length, is identified along each edge of a mask feature. A matrix is derived containing a plurality of contribution of movement factors, each representing the contribution to light amplitude due to movement of the respective region normal to the region. The movement for each region is a solution of the matrix.

In one embodiment, the matrix is derived by identifying an amplitude curve associated with distance from a center of a disk of light. The length of each line between a midpoint R of each region and each of a plurality of points W along edges of the mask feature are identified. A plurality of contributions of movement factors are derived, each based on the amplitude curve, the length of the respective line and the size of the disk of light. The matrix of the contributions of movement is derived from the plurality of contribution of movement factors.

In preferred embodiments, the movement of each region is defined by calculating an error amplitude for each point W along edges of the mask feature. A plurality of linear expressions are derived from the matrix and a cost function is derived for each point W based on the respective linear expression and an error value. The amount that a region is to be moved is based on minimizing a cost function.

In preferred embodiments, the cost function is derived by subtracting the error value for each point W from the respective linear expression to identify a discrepancy for each point. The value of the discrepancy is symbolically squared. The movement for the region is calculated by deriving $$\frac{\partial F}{\partial V}$$

for each region, where F is the cost function and V is the amount of movement of the respective region. The value of V is calculated for each region based on a solution of all equations $$\frac{\partial F}{\partial V} = 0.$$

Also preferably, the cost function is optimized by adding correction terms for additional optimization goals to the cost function.

In preferred embodiments, the error amplitude is derived from a light amplitude for each point W and a target light intensity.

Preferably, the amount of movement is adjusted for each region whose area of movement may be affected by movement of an adjacent region. One technique for adjusting the amount of movement includes calculating the area of movement of one region based on the length of that region and its amount of defined movement. Changes in area of movement of that region due to movement of regions adjacent that region are identified. The amount of movement of that region is adjusted so that the area moved equals the calculated area.

According to another aspect of the invention, a computer useable medium contains a computer readable program comprising code that causes a computer to correct mask definitions for the effects of light diffraction.

BRIEF DESCRIPTION OF THE DRAWINGS

FIG. 1 is a flow chart of the process of the present invention.

FIGS. 2–8 are illustrations useful in explaining the steps illustrated in FIG. 1.

DETAILED DESCRIPTION OF THE PREFERRED EMBODIMENTS

FIG. 1 is a flow chart illustrating the process of substrate correction optimization in accordance with the presently preferred embodiment of the present invention. At step 100, aerial images of the mask, and of a small disk, are digitally encoded. Photographic mask 200, illustrated in FIG. 2, includes a portion 202 (an aperture for a positive mask or a light-blocking portion 202 for a negative mask) that is an uncorrected version of the desired pattern to be formed on a thin film wafer or substrate. The initial mask pattern conforms to the desired pattern of features to be formed on the substrate. The disk represents a small spot of light or spot of darkness, one that is small enough such that the difference of light amplitude inside and outside the spot is well below 50%. That is, the difference of light wave height inside the spot to that outside the spot is less than 50% of a maximum wave height.

For example, in the case of a negative mask where the light-blocking portions represent features being formed, the light amplitude far removed from the disk center is at 100% of wave height, and the amplitude inside the disk due to diffraction should be more than 50% of that wave height. If the mask is a positive mask where the light-passing portions represent features being formed, the light amplitude far removed from the disk due to diffraction is 0%, and the amplitude inside the disk should be less than 50%. Moreover, the spot should be large enough to obtain a good signal-to-noise ratio for the light amplitude from the spot relative to background light. Typically, the disk will have a width (diameter) of less than about one-half wavelength. For example, for a photolithographic process performed with ultraviolet light having a wavelength of 248 nanometers, the width of the disk representing the spot of light is less than about 125 nanometers. In the example to be described herein, the spot of light is 100 nanometers in diameter, resulting in a disk having an area of 7854 square nanometers.

The aerial image of the disk is represented by a table of numbers, stored in a computer memory, identifying the amplitude of light at various distances from the center of the disk. (While the aerial image is actually a two-dimensional grid of numbers identifying light amplitude at various locations from disk center, since the disk is circular, the light amplitude varies with the radial distance from disk center, regardless of the direction of the radius. Consequently, the aerial image of the disk is converted to a one-dimensional table indexed by distance from disk center.) The amplitude of the light, $A_D$, for various distances, D, from disk center, is derived from the intensity of light measured at the various distances, D, and the background light intensity measured distal from the disk. The values of light amplitude, $A_D$, are obtained by subtracting the square root of the background light intensity from the square root of the respective light intensity at distances D. Thus, $A_D=\sqrt{I_D}-\sqrt{I_B}$, where $I_D$ is the light intensity at the distance D from center and $I_B$ is the background light intensity. Table I sets forth typical values of light amplitude factors at various distances from disk center expressed as a percentage of a maximum amplitude.

TABLE I

| Distance from Center (nm) | Amplitude (% maximum) |
| --- | --- |
| 0 | 26.238 |
| 100 | 15.303 |
| 200 | 02.400 |
| 300 | −00.054 |
| 400 | 00.339 |
| 500 | −00.338 |
| 600 | −00.161 |
| 700 | −00.100 |

FIG. 3 illustrates a curve 204 representing a plot of the data of Table I. Curve 204 has a maximum amplitude at center, decreasing to near zero further from the center. As shown at point 206 on the curve of FIG. 3, ripples may exist due to light interference.

FIG. 4 illustrates a plurality of light contour lines for mask 200. Each light contour line 210 represents a different light amplitude, such as 0.45 (45%), 0.55 (55%), etc. The goal of the present invention is to provide a mask, exposure of which causes the contour line associated with a target light intensity to match edges of the features on the original mask as closely as possible. In one embodiment, the target light intensity is measured during IC fabrication process development. Typically, the target light intensity is between 20% and 35%, giving a target light amplitude between 45% and 60%.

At step 104, N points are selected along each edge of all features on the pattern, except points close to the corners, as explained below. Thus, as shown in FIG. 5, a plurality of points W1, W2, W3 and W4 are selected along edges 212, 214 and 216 of the feature defined by mask 200. At steps 106–110, a light amplitude error E is identified for each point W as a deviation of the actual light amplitude from the target light amplitude. This is illustrated in FIG. 6.

FIG. 4 illustrates light amplitude contour lines 210 represented by the aerial image of mask 200. The digital representation of the aerial image identifies light amplitude values at grid locations associated with the mask. At step 106 the initial light amplitudes, $A_W$, are identified for each point W from the digital representation of the aerial image. Thus, if a point W coincides exactly with a grid point on the aerial image, the light amplitude value for point W is that corresponding with the matching grid point. Otherwise, the light amplitude value for point W is interpolated from surrounding grid points. At step 110, the light amplitude error E is identified for each point W as the initial light amplitude minus the target light amplitude, $E_W=A_W-A_T$, where $A_T$ is the target light amplitude and is equal to $\sqrt{I_T}$. Hence, $E_W=A_W-\sqrt{I_T}$. For example, if the initial light amplitudes, $A_W$, at points W1–W4, are 0.50 (point W1), 0.53 (point W2), 0.60 (point W3) and 0.55 point W4), and the target light amplitude is 0.55, the resulting error values are −0.05 (point W1), −0.02 (point W2), +0.05 (point W3) and 0 (point W4). These error values E[1, . . . N] are saved to an error table for points W[1, . . . N].

As stated above, locations "close" to corners of the pattern are not taken into account during this process. The reason is that light diffraction tends to round sharp corners during the exposure process, which renders it impractical to exactly match the shape of the mask at sharp corners. Therefore, it is not necessary to duplicate corners any closer than about one-half wavelength. Consequently, measurement points are not selected at positions that are less than about one-half wavelength (124 nanometers, in the example) from the corners. The foregoing notwithstanding, every edge must have at least one measurement point.

At step 112, the edges 212, 214 and 216 of the pattern feature 200 are divided into M regions, each having a length, L[1, . . . M] and a midpoint, R[1, . . . M]. For the example herein, each edge 212, 214, 216 forms a single region T1, T2, T3 having a length L1, L2, L3 and a midpoint R1, R2, R3. Moreover, as shown in FIG. 7, midpoints R1 and R2 are assumed to be coincident with points W1 and W2, and midpoint R3 is assumed to be midway between points W3 and W4 on edge 216. It will be appreciated that these assumptions are made for simplicity of explanation of the invention, and that in practice the regions do not need to encompass an entire edge, nor does a midpoint need to be coincident with a selected point W[j] nor be spaced equidistant from points W on an edge. Instead, the length L[i] of a region T is arbitrary, and a given edge may be divided into plural regions T. Moreover, the midpoint R[i] of a region is based solely on the positions of the end points of the region.

At step 114, the distances between each midpoint R and all points W are calculated, and at step 116 a light amplitude factor, A[1 ... M, 1 ... N] is identified for each distance between points R[1 ... M] and W[1 ... ] based on the table (i.e., Table I) representing the aerial image of the disk. In the example herein, the line between points R2 and W4 represent a distance of 140 nanometers. Interpolating from Table I, this distance has a corresponding amplitude factor of 8% (0.08000), see the curve of FIG. 3. Hence, for the line between points R2 and W4, the light amplitude factor, A[2,4] is 0.08000.

At step 118, a contribution of movement factor C is calculated to provide a contribution to the light amplitude due to movement of a region T in a direction normal to the region, in terms of amplitude per unit distance moved. For each R[i] and W[j], the contribution of movement factor C[i,j] is $$C[i,j] = \frac{A[i,j] \cdot L[i]}{Area\ of\ Disk}.$$

If the length L2 of edge 214 is 900 nanometers and the area of the disk is 7854 square nanometers, the contribution of movement factor, C[2,4] is 0.00917 (0.917%) of the amplitude per unit distance moved. Therefore, the change of light amplitude at point W4 associated with the region along edge 214 is 0.917% for each nanometer that edge 214 is moved in a direction normal to the region. The collection of contributions of movements is a matrix identified as. C[1 ... M, 1 ... N].

Each row in the matrix formed in step 118 is a linear expression for the change in amplitude at a measurement point i as a function of a set of variables V[1 ... M] that represent the distance an edge 212, 214, 216 could be moved.

$$C_{1i}V_1 + C_{2i}V_2 + \ldots C_{Mi}+V_M.$$

The light amplitude error, $E_i$, for each measurement point i (FIG. 6) is subtracted from the above function to derive a function $C_{1i}V_1 + C_{2i}V_2 + \ldots + C_{Mi}V_M - E_i$. Thus, for the four measurement points W1, W2, W3, W4, the discrepancies $D_1, D_2, D_3, D_4$ are $$D_1 = C_{2,1}V_1 + C_{3,1}V_2 + C_{4,1}V_3 - E_1$$

$$D_2 = C_{1,2}V_1 + C_{3,2}V_2 + C_{4,2}V_3 - E_2$$

$$D_3 = C_{1,3}V_1 + C_{2,3}V_2 + C_{4,3}V_3 - E_3$$

$$D_4 = C_{1,4}V_1 + C_{2,4}V_2 + C_{3,4}V_3 - E_4$$

At step 120, a partial cost function is derived. The discrepancies are symbolically squared. For example for $D_4$:

$$D_4^2 = C_{1,4}^2 V_1^2 + C_{2,4}^2 V_2^2 + C_{3,4}^2$$

$$V_3^2 + E_4^2 + 2(C_{1,4}C_{2,4}V_1V_2 + C_{1,4}C_{3,4}V_1$$

$$V_3 + C_{2,4}C_{3,4}V_2V_3) - 2(C_{1,4}V_1E_4 + C_{2,4}$$

$$V_2E_4 + C_{3,4}V_3E_4).$$

This gives the contribution to the cost function of any discrepancy between the amplitude contributed by the correctors and the measured error $E_i$ at each measurement point. These terms are symbolically added for all N points to derive the partial cost function, $F_{part}$ as the sum of the squared functions $F_{part} = D_1^2 + D_2^2 + D_3^2 + D_4^2$.

At step 122, additional terms may be added to the sum of these partial cost function expressions $F_{part}$ for additional optimizational goals. For example, it is desired to maintain the correction factor as small as possible, which can be achieved by symbolically adding $V_1^2 + V_2^2 + \ldots + V_M^2$ to the cost function expression. To maintain mask distortion as smooth as possible, corrections to adjacent regions of an edge should be made close to the same size. This is accomplished by adding $(V_j - V_k)^2$ to the cost function for any pair of adjacent regions T[j] and T[k] along a mask edge. If desired, some terms may be multiplied by weighting factors to make them more or less important relative to other terms. Since this small example does not have two adjacent regions along any edge, it's completed cost function is expressed by $$F = D_1^2 + D_2^2 + D_3^2 + D_4^2 + V_1^2 + V_2^2 + V_3^2.$$

The cost function achieved at step 122 is a sum of parabolic functions. The goal is to find the lowest value for the sum of parabolic functions. This is achieved at step 124 by symbolically differentiating the cost function expression with respect to each variable V to derive a set of M linear expressions for the M partial derivatives. To find the lowest value for the set of parabolic functions, each of the linear expressions is set to 0 at step 126 and the set of linear equations is solved at step 128 using standard linear algebra, such as Gaussian Elimination or Conjugate Gradient. For example for three terms, partial derivatives are found as $$\frac{\partial F}{\partial V_1}, \quad \frac{\partial F}{\partial V_2} \quad \text{and} \quad \frac{\partial F}{\partial V_3}.$$

Setting these functions to zero and solving for the three variables $V_1$, $V_2$, and $V_3$, the optimal rectilinear edge movement in a direction normal to the region is derived for each region.

At step 130, the edge movement V[j] is multiplied by the length L[j] of the region for each region T[j]. The result is the desired area change for region T[j] of the mask. The area change can be implemented by moving an edge by a distance V[j] if neighboring regions are parallel to it and other design rules are not violated.

If a region is adjacent a corner, movement could give a wrong area change. As shown in FIG. 8, movement of edges 212, 214 and 216 to positions 220, 222 and 224, respectively can create errors due to change in area due to the corners of the regions. The area of a region T[j] is intended to be increased by an amount equal to its length L[j] times the corresponding edge movement V[j], but due to movement of an adjacent region T[k], the increase of area of region T[j] is altered by a section defined by $$\frac{V_j^2 \cdot \cos \Phi_j}{2},$$

where $\Phi_j$ is the angle between a line normal to the edge of region T[j] and a line along the movement of the corner between regions T[j] and T[k]. Thus, the actual area change due to movement of an edge of length $L_j$ by a distance $V_j$ is $L_j \cdot V_j + V_j^2(\cos \Phi_j + \cos \Theta_j)$, where $\Phi_j$ is the angle at the corner between regions T[j] and T[k] and $\Theta_j$ is the angle at the corner between regions T[j] and T[i].

In FIG. 8, the area of region T1 is altered by the area defined by $V_1 \cdot L_1$ due to movement of edge 212, and is also altered by $$\frac{V_1^2 \cdot \cos\Phi_1}{2}$$

due to movement of region T2 and by $$\frac{V_1^2 \cdot \cos\Theta_1}{2}$$

due to the movement of region T3. (The section defined by movement of region T2 is additive on to the area to region T1, whereas the section defined by movement of region T3 is subtractive from the area of T1.) Consequently, the actual area change due to movement of edge 212 is $$L_1 \cdot V_1 + \frac{V_1^2}{2}(\cos\Phi_1 - \cos\Theta_1),$$

resulting in an error in area change of $$\frac{V_1^2}{2}(\cos\Phi_1 - \cos\Theta_1).$$

To address the area error, at step 132 the area of movement of the edge of region $T_j$ (e.g., movement of edge 212 to position 220) is restated as $$L_j \cdot X_j + \frac{V_j^2}{2}(\cos\Phi_j + \cos\Theta_j),$$

where $X_j$ is the corrected movement of the edge. This expression is set equal to the area defined at step 130 and the resulting quadratic equation $$Area_{Tj} = L_j \cdot V_j = L_j \cdot X_j + \frac{V_j^2}{2}(\cos\Phi_j + \cos\Theta_j)$$

is solved for X[j] using the well-known quadratic formula. In the example, the actual (corrected) movement of edge 212 is defined by $X_1$ in $$Area_{T1} = L_1 \cdot V_1 = L_1 \cdot X_1 + \frac{X_1^2}{2}(\cos\Phi_1 - \cos\Theta_1).$$

At step 134, the edges are moved by the computed amounts, and at step 136 the edge corrections are checked to all other features of the corrected mask for spacing rule violations. At step 138, an aerial image of the corrected mask is constructed and at step 140, the process loops back and repeats steps 106–138.

The process is repeated or iterated such number of times as may be required to achieve optimal results, until minimal changes occur in a given iteration.

In the event of a spacing rule violation at step 136, for example if a corrector j causes a point to move into a region it was supposed to remain clear from, correction may be made simply by replacing V[j] with a constant to keep the feature out of the violated region. If two correctors cause a spacing violation, one of the correctors may be replaced with a constant based on the other corrector to maintain proper rule spacing. For example, if correctors j and k caused a spacing violation, V[k] may be replaced with (X−V[j]) where X is a constant necessary to maintain the features apart.

The present invention is preferably carried out though use of a computer programmed to carry out the process. Those skilled in the art will appreciate that the mask features and light contours illustrated in the drawings are merely representations of a mask or light contour that is actually modeled by the computer and are defined by the program code. The present invention is carried out by a computer system having a computer readable storage medium, such as a hard disk drive. A computer readable program code is embedded in the medium and contains instructions that cause the computer to carry out the steps of the process, including modeling the light and mask features, selecting regions of the edges of the features and points on the regions and edges for carrying out the process. The computer code directs the derivation of the matrix and the solution of the linear equations to define movement for each region, and to adjust the mask based on movement of adjacent regions. The result is a computer-generated mask most closely producing the desired features on a wafer or substrate during a photolithographic process.

The present invention thus provides an effective technique for correcting masks for use in photolithographic processes to correct diffraction issues. The process is effective in use and minimizes error due to light diffraction at a lower cost than prior techniques.

Although the present invention has been described with reference to preferred embodiments, workers skilled in the art will recognize that changes may be made in form and detail without departing from the spirit and scope of the invention.

What is claimed is:

1. A process of designing a mask for use in a photolithographic process to offset effects of light diffraction comprising steps of:

a) identifying at least one region of each of a plurality of edges of a mask feature, each identified region having a length along the respective edge;

b) identifying a light value associated with distance from a center of a disk of light;

c) identifying a length of each line between a midpoint of each region and each of a plurality of points along edges of the mask feature;

d) for each line, deriving a contribution of movement factor each based on the light value associated with the length of the line, the length of the respective region and a size of the disk of light;

e) deriving a matrix of contributions of movement from the plurality of contribution of movement factors; and f) moving each region by an amount derived from the matrix.

2. The process of claim 1, wherein the diameter of the light disk is not greater than one-half the wavelength of the light.

3. The process of claim 1, wherein step (f) includes steps of:

f1) calculating an error value for each point, f2) deriving a plurality of linear expressions from the matrix, each expression containing a set of variables, each variable representing movement of a respective region, and f3) deriving a cost function for all points based on the respective linear expression and error value, and f4) calculating the movement for each region based on a minimal cost function.

4. The process of claim 3, wherein step (f1) includes steps of:
   i) identifying a light value at each point based on an aerial image of the mask, and
   ii) calculating the error value for each point based on the light value at the respective point and a target light value.

5. The process of claim 3, wherein step (f3) includes steps of:
   i) subtracting the error value for each point from the respective linear expression to identify a discrepancy for each point,
   ii) symbolically squaring each discrepancy, and
   iii) adding the symbolically squared discrepancies to derive a partial cost function.

6. The process of claim 3, wherein step (f4) includes steps of:
   i) deriving a relationship of the cost function as a function of movement for each region, and
   ii) calculating the amount of movement for each region based on a solution of the relationship set equal to zero.

7. The process of claim 5, wherein step (f3) further includes steps of:
   iv) optimizing the cost function by adding correction terms for additional optimization goals to the partial cost function derived at step (f3iii).

8. A process of designing a mask for use in a photolithographic process to offset effects of light diffraction comprising steps of:
   a) identifying at least one region of each of a plurality of edges of a mask feature, each identified region having a length along the respective edge;
   b) deriving a matrix of contributions of movement factors that define changes in light value due to movement of each region normal to the edge;
   c) moving each region by an amount derived from the matrix; and
   d) adjusting the amount of movement for each region whose area of movement is affected by movement of an adjacent region.

9. The process of claim 8, wherein step (d) includes steps of:
   d1) calculating the area of movement of a region based on the length of the region and the amount of defined movement of the region,
   d2) identifying changes in area of movement of the region due to movement of regions adjacent the region, and
   d3) adjusting the amount of movement of the region so that the area moved equals the area calculated in step (d1).

10. A computer usable medium having a computer readable program embodied therein for addressing data, the computer readable program in the computer usable medium comprising:
    first computer readable program code defining a mask for use in a photolithographic process, the mask having at least one feature having a plurality of edges, the first computer readable program code further defining at least one region having a length along each edge of the mask feature;
    second computer readable program code defining a table of light values and distances from a center of a light disk;
    third computer readable program code for causing the computer to identify a length of each line between a midpoint of each region and each of a plurality of points along edges of the mask feature;
    fourth computer readable program code for causing the computer to derive a contribution of movement factor for each line based on (i) the light value corresponding to the distance that matches the length of the respective line, (ii) the length of the respective region, and (iii) a size of the light disk; and
    fifth computer readable program code for causing the computer to derive a matrix of contributions of movement factors; and
    sixth computer readable program code for causing the computer to define movement for each region by an amount derived from the matrix.

11. The computer usable medium of claim 10, wherein the diameter of the light disk is not greater than one-half the wavelength of the light.

12. The computer usable medium of claim 10, wherein the sixth computer readable code comprises:
    seventh computer readable program code for causing the computer to derive a plurality of linear expressions from the matrix, each expression containing a set of variables, each variable representing movement of the respective region,
    eighth computer readable program code for causing the computer to calculate an error value for each of a plurality of points along edges of the mask feature,
    ninth computer readable program code for causing the computer to derive a cost function for all points based on the respective linear expression and error value, and
    tenth computer readable program code for causing the computer to calculate movement for each region based on a minimal cost function.

13. The computer usable medium of claim 12, wherein the eighth computer readable program code comprises:
    computer readable program code for causing the computer to identify a light value at each of a plurality of points along edges of the mask feature based on the mask definition of the first computer readable program code, and
    computer readable program code for causing the computer to calculate the error value based on the light value at each point and a target light value.

14. The computer usable medium of claim 12, wherein the ninth computer readable program code includes:
    eleventh computer readable program code for causing the computer to identify a discrepancy for each point based on a difference between the error value for each point and the respective linear expression,
    twelfth computer readable program code for causing the computer to symbolically square each discrepancy to derive the cost function.

15. The computer usable medium of claim 12, wherein the tenth computer readable program code includes:
    computer readable program code for causing the computer to derive a relationship of the cost function as a function of movement for each region, and
    computer readable program code for causing the computer to calculate the amount of movement for each region based on a solution of the relationship set equal to zero.

16. The computer usable medium of claim 14, wherein the ninth computer readable program code further includes:
    computer readable program code for causing the computer to optimize the cost function by adding correction terms for additional optimization goals to the partial cost function derived by the computer under control of the twelfth computer readable program code.

17. A computer usable medium having a computer readable program embodied therein for addressing data, the computer readable program in the computer usable medium comprising:

first computer readable program code for causing the computer to define a mask for use in a photolithographic process, the mask having at least one feature having a plurality of edges, the first computer readable program code further defining at least one region having a length along each edge of the mask feature;

second computer readable program code for causing the computer to derive a matrix of contribution of movement factors defining contributions to light value due to movement of each region normal to the edge;

third computer readable program code for causing the computer to define movement for each region by an amount derived from the matrix; and fourth computer readable program code for causing the computer to adjust the amount of movement of each region whose area of movement is affected by movement of an adjacent region.

18. The computer usable medium of claim 17, wherein the fourth computer readable program code comprises:

computer readable program code for causing the computer to calculate the area of movement of a region based on the length of the region and the amount of defined movement of the region, computer readable program code for causing the computer to identify changes in area of movement of the region due to movement of regions adjacent the region, and computer readable program code for causing the computer to adjust the amount of movement of the region so that the area moved equals the calculated area.

19. A process of designing a mask for use in a photolithographic process to offset effects of light diffraction comprising steps of:

a) identifying at least one region of each of a plurality of edges of a mask feature, each identified region having a length along the respective edge;

b) identifying a plurality of points along edges of the mask feature;

c) deriving a matrix of contributions of movement factors that define changes in light value due to movement of each region normal to the region;

d) calculating an error value for each point, e) deriving a plurality of linear expressions from the matrix, each expression containing a set of variables, each variable representing movement of a respective region;

f) deriving a cost function for all points based on the respective linear expression and error value;

g) calculating the movement for each region based on a minimum cost function; and h) moving each region by the calculated amount.

20. The process of claim 19, wherein step (d) includes steps of:

d1) identifying a light value at each point based on an aerial image of the mask, and d2) calculating the error value for each point based on the light value at the respective point and a target light value.

21. The process of claim 19, wherein step (f) includes steps of:

f1) subtracting the error value for each point from the respective linear expression to identify a discrepancy for each point, f2) symbolically squaring each discrepancy, and f3) adding the symbolically squared discrepancies to derive a partial cost function.

22. The process of claim 21, wherein step (f) further includes steps of:

f4) optimizing the cost function by adding correction terms for additional optimization goals to the partial cost function derived at step (f3).

23. A computer usable medium having a computer readable program embodied therein for addressing data, the computer readable program in the computer usable medium comprising:

first computer readable program code defining a mask for use in a photolithographic process, the mask having at least one feature having a plurality of edges, the first computer readable program code further defining at least one region having a length along each edge of the mask feature;

second computer readable program code for causing the computer to derive a matrix of contribution of movement factors defining contributions to light value due to movement of each region normal to the edge;

third computer readable program code for causing the computer to derive a plurality of linear expressions from the matrix, each expression containing a set of variables, each variable representing movement of the respective region;

fourth computer readable program code for causing the computer to calculate an error value for each of a plurality of points along edges of the mask feature;

fifth computer readable program code for causing the computer to derive a cost function for all points based on the respective linear expression and error value; and sixth computer readable program code for causing the computer to calculate the amount of movement for each region based on a minimum cost function.

24. The computer usable medium of claim 23, wherein the fourth computer readable program code comprises:

computer readable program code for causing the computer to identify a light value at each of a plurality of points along edges of the mask feature based on the mask definition of the first computer readable program code, and computer readable program code for causing the computer to calculate the error value based on the light value at each point and a target light value.

25. The computer usable medium of claim 23, wherein the fifth computer readable program code includes:

seventh computer readable program code for causing the computer to identify a discrepancy for each point based on a difference between the error value for each point and the respective linear expression, eighth computer readable program code for causing the computer to symbolically square each discrepancy to derive the cost function.

26. The computer usable medium of claim 25, wherein the fifth computer readable program code further includes:

computer readable program code for causing the computer to optimize the cost function by adding correction terms for additional optimization goals to the partial cost function derived by the computer under control of the eighth computer readable program code.

* * * * *